(12) United States Patent
Kwon

(10) Patent No.: US 10,193,071 B2
(45) Date of Patent: Jan. 29, 2019

(54) DEVICE AND METHODS FOR MANUFACTURING AN ORGANIC LIGHT-EMITTING DISPLAY APPARATUS

(71) Applicant: Samsung Display Co., Ltd., Yongin-si (KR)

(72) Inventor: Seungwook Kwon, Yongin-si (KR)

(73) Assignee: Samsung Display Co., Ltd, Yongin-si (KR)

( * ) Notice: Subject to any disclaimer, the term of this patent is extended or adjusted under 35 U.S.C. 154(b) by 0 days.

(21) Appl. No.: 15/138,566

(22) Filed: Apr. 26, 2016

(65) Prior Publication Data

US 2017/0098766 A1 Apr. 6, 2017

(30) Foreign Application Priority Data

Oct. 2, 2015 (KR) ........................ 10-2015-0139106

(51) Int. Cl.
| | | |
|---|---|---|
| *H01L 51/00* | (2006.01) | |
| *H01L 27/32* | (2006.01) | |
| *H01L 51/50* | (2006.01) | |
| *H01L 51/52* | (2006.01) | |
| *H01L 51/56* | (2006.01) | |

(52) U.S. Cl.
CPC ........ *H01L 51/005* (2013.01); *H01L 27/3211* (2013.01); *H01L 27/3246* (2013.01); *H01L 27/3262* (2013.01); *H01L 51/0026* (2013.01); *H01L 51/0096* (2013.01); *H01L 51/5056* (2013.01); *H01L 51/5072* (2013.01); *H01L 51/5088* (2013.01); *H01L 51/5092* (2013.01); *H01L 51/5221* (2013.01); *H01L 51/5256* (2013.01); *H01L 51/56* (2013.01); *H01L 2227/323* (2013.01)

(58) Field of Classification Search
None
See application file for complete search history.

(56) References Cited

U.S. PATENT DOCUMENTS

| 8,995,022 B1 * | 3/2015 | Vronsky | ............. H01L 51/0005 257/40 |
| 2006/0139417 A1 * | 6/2006 | Iwamoto | ............... B41F 31/022 347/85 |

(Continued)

FOREIGN PATENT DOCUMENTS

| KR | 10-2008-0041780 | 5/2008 |
| KR | 10-2011-0093985 | 8/2011 |

(Continued)

OTHER PUBLICATIONS

"Roll-to-roll manufacturing for small moleculeflexible Oled devices" by Mogck et al., Jul. 2012.*

*Primary Examiner* — Evren Seven
(74) *Attorney, Agent, or Firm* — H.C. Park & Associates, PLC

(57) ABSTRACT

A method of manufacturing an organic light-emitting display apparatus includes: arranging a mask on a substrate, the mask having an opening corresponding to a pattern of an organic emission layer; forming the organic emission layer by disposing an inkjet roller on the mask, and discharging inks from ink headers mounted in the inkjet roller through the opening of the mask, by rotating the inkjet roller; and curing the organic emission layer.

11 Claims, 6 Drawing Sheets

(56) References Cited

U.S. PATENT DOCUMENTS

| | | | |
|---|---|---|---|
| 2006/0185534 A1* | 8/2006 | Kobayashi | B41L 13/06 101/120 |
| 2007/0120469 A1* | 5/2007 | Ha | H01L 51/0005 313/504 |
| 2010/0209614 A1* | 8/2010 | Sakata | H01L 21/02 427/402 |
| 2011/0117333 A1* | 5/2011 | Furukawa | G03F 7/0007 428/195.1 |
| 2011/0221741 A1 | 9/2011 | Kawamura et al. | |
| 2011/0225799 A1 | 9/2011 | Shimoda et al. | |
| 2012/0056923 A1* | 3/2012 | Vronsky | B41J 2/0456 347/12 |
| 2013/0005076 A1* | 1/2013 | Vronsky | B41J 2/14427 438/99 |
| 2014/0021458 A1* | 1/2014 | Tada | H01L 27/3246 257/40 |
| 2014/0028771 A1* | 1/2014 | Yamada | B41J 2/0057 347/104 |
| 2014/0161968 A1 | 6/2014 | Kang | |
| 2014/0184683 A1* | 7/2014 | Harjee | H01L 51/0005 347/14 |
| 2014/0206119 A1 | 7/2014 | Kang | |
| 2014/0315336 A1* | 10/2014 | Yoo | H01L 51/56 438/22 |
| 2014/0346472 A1* | 11/2014 | Chen | H01L 27/3246 257/40 |
| 2014/0356994 A1* | 12/2014 | Shim | H01L 21/02343 438/29 |
| 2015/0132879 A1* | 5/2015 | Takata | H05B 33/10 438/46 |
| 2017/0033288 A1* | 2/2017 | Takahashi | B05D 7/00 |
| 2017/0098766 A1* | 4/2017 | Kwon | H01L 27/3211 |

FOREIGN PATENT DOCUMENTS

| | | |
|---|---|---|
| KR | 10-2011-0105358 | 9/2011 |
| KR | 10-2014-0074629 | 6/2014 |
| KR | 10-2014-0093512 | 7/2014 |

* cited by examiner

DEVICE AND METHODS FOR MANUFACTURING AN ORGANIC LIGHT-EMITTING DISPLAY APPARATUS

CROSS-REFERENCE TO RELATED APPLICATION

This application claims priority from and the benefit of Korean Patent Application No. 10-2015-0139106, filed on Oct. 2, 2015, which is hereby incorporated by reference for all purposes as if fully set forth herein.

BACKGROUND

Field

Exemplary embodiments relate a device and methods for to manufacturing an organic light-emitting display apparatus.

Discussion of the Background

Generally, display apparatuses may be used in mobile devices, such as smart phones, laptop computers, digital cameras, camcorders, personal digital assistants (PDAs), and tablet personal computers, or other electronic devices, such as desktop computers, televisions, or outdoor billboards.

Flexible display apparatuses have drawn attention as next generation display apparatuses, since flexible display apparatuses are portable and may be applied to electronic devices of various shapes. Among the flexible display apparatuses, a flexible display apparatus having an organic light-emitting display technique is one of the most attractive display devices. The organic light-emitting display apparatus includes an organic emission layer to realize an image. The organic emission layer may be formed on a substrate by various methods.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide methods and a device for manufacturing an organic light-emitting display apparatus.

Additional aspects will be set forth in the detailed description which follows, and, in part, will be apparent from the disclosure, or may be learned by practice of the inventive concept.

An exemplary embodiment includes a method of manufacturing an organic light-emitting display apparatus. The method includes: arranging a mask on a substrate, the mask having an opening corresponding to a pattern of an organic emission layer; forming the organic emission layer by disposing an inkjet roller on the mask, and discharging inks from ink headers mounted in the inkjet roller through the opening of the mask by rotating the inkjet roller; and curing the organic emission layer.

An exemplary embodiment also includes a device for manufacturing an organic light-emitting display apparatus. The device includes a mask mounted on a substrate, an inkjet roller arranged on the substrate, the inkjet roller including an ink header configured to discharge ink onto the substrate through an opening of the mask; an ink storage tank connected to the ink header by a connection unit; and a control unit configured to control the ink discharged onto the substrate from the ink header.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION

Figure 1:
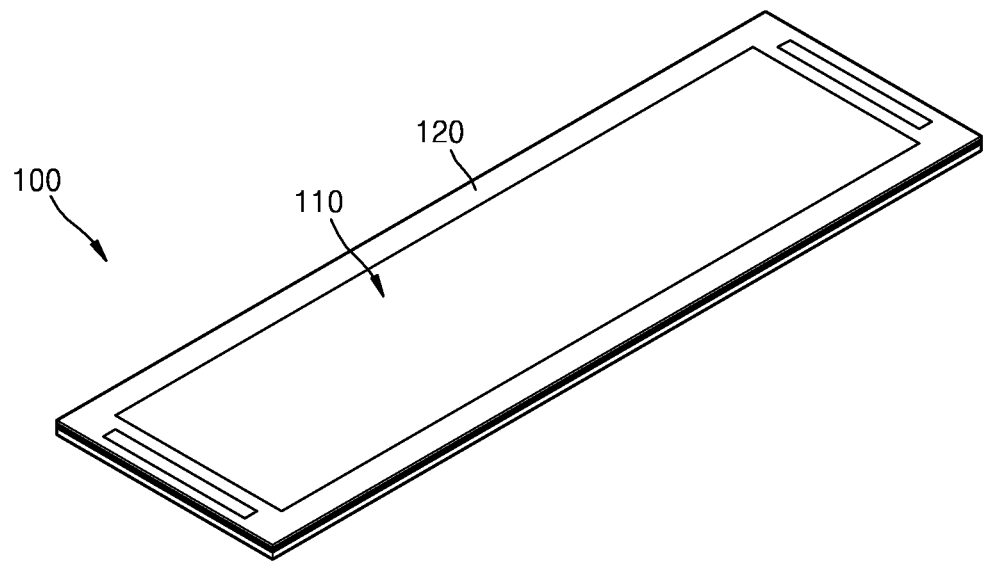
FIG. 1 is a perspective view of an unrolled state of a display apparatus according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
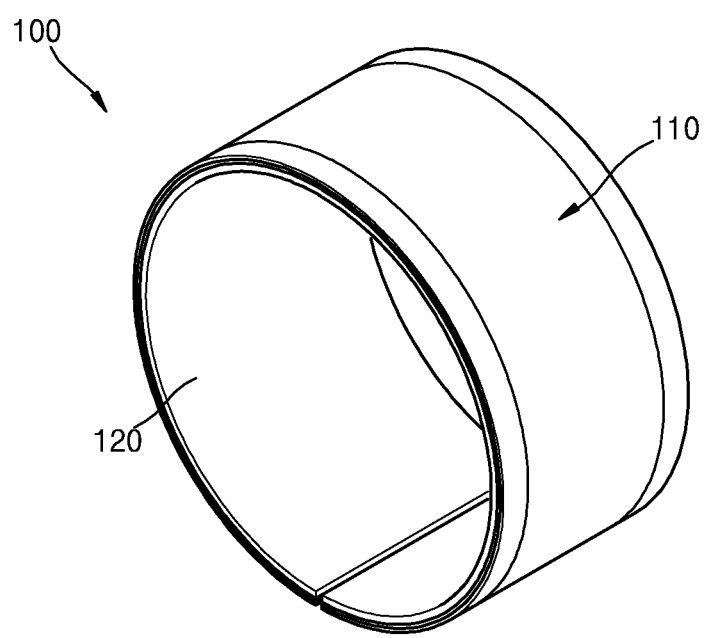
FIG. 2 is a perspective view of a rolled state of the display apparatus of FIG. 1.

FIG. 1 is a perspective view of an unrolled state of an organic light-emitting display apparatus according to an exemplary embodiment. FIG. 2 is a perspective view of a rolled state of the organic light-emitting display apparatus of FIG. 1.

As shown in FIG. 1, an organic light-emitting display apparatus 100 may be a flexible display apparatus including a flexible film. However, the organic light-emitting display apparatus 100 may also be a rigid display apparatus including a glass substrate.

Referring to FIG. 1 and FIG. 2, the organic light-emitting display apparatus 100 may include a display panel 110 for displaying an image and a housing 120 for accommodating the display panel 110. The display panel 110 may include not only a display substrate, but also various films, such as a touch screen, a polarization plate, a cover window, etc.

The organic light-emitting display apparatus 100 may display an image at various angles. For example, the organic light-emitting display apparatus 100 may display an image while in a rolled state, an unrolled state, a curved state, or some combination thereof.

Figure 3:
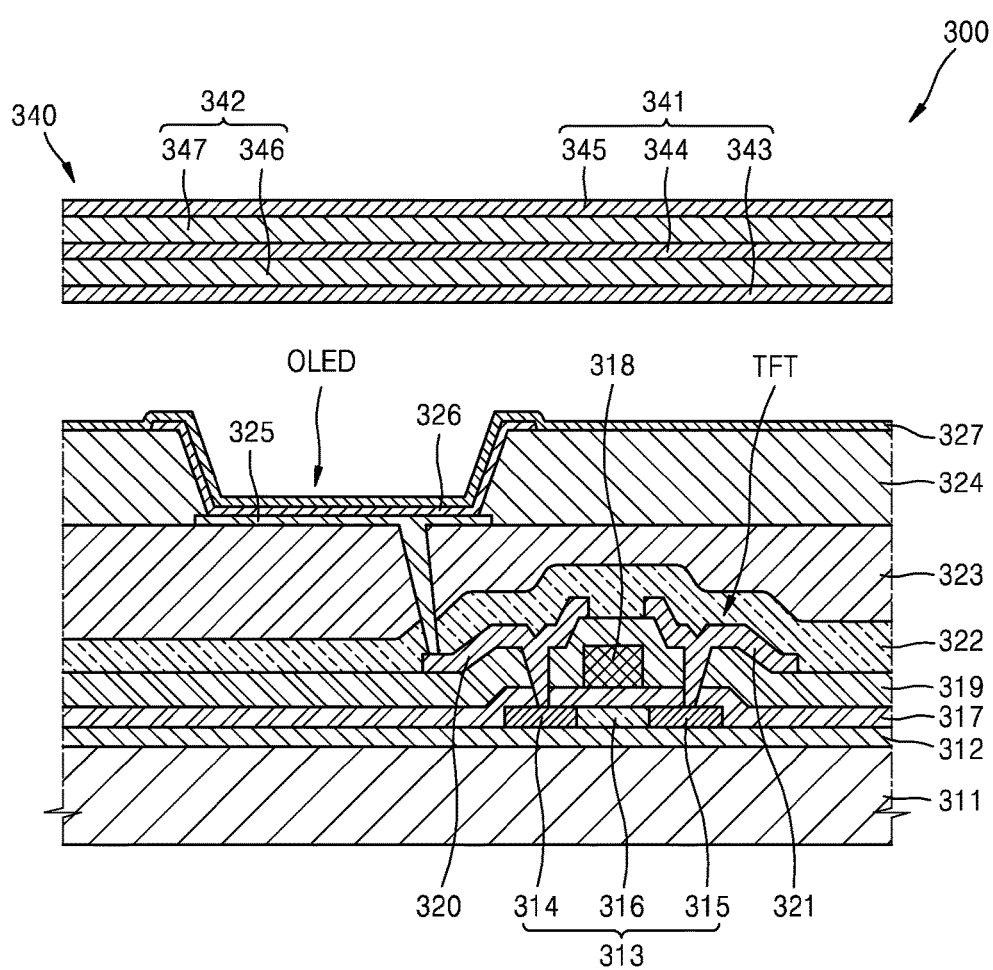
FIG. 3 is a cross-sectional view of a sub-pixel of an organic light-emitting display apparatus according to an exemplary embodiment.

FIG. 3 illustrates a sub-pixel of an organic light-emitting display apparatus 300 according to an exemplary embodiment.

As shown in FIG. 3, the sub-pixel may include at least one thin film transistor (TFT) and an organic light-emitting device (OLED). However, the numbers and structures of TFTs may vary without departing from the scope of the present embodiments.

Referring to FIG. 3, the organic light-emitting display apparatus 300 may include a display substrate 311 and an encapsulation portion 340 disposed on the display substrate 311.

The display substrate 311 may include at least one of a polymer substrate, a glass substrate, and a metal substrate. The display substrate 311 may be a flexible substrate, a rigid substrate, or some combination thereof. The display substrate 311 may be transparent, non-transparent, partially transparent, or some combination thereof.

According to an exemplary embodiment, the polymer substrate may include at least one of polyimide (PI), polyethylene terephthalate (PET), polymethyl methacrylate (PMMA), polycarbonate (PC), and polypropylene (PP).

The polymer substrate may have a thickness that is equal to or greater than 20 μm. The glass substrate may have a thickness that is equal to or greater than 0.05 mm. The metal substrate may include at least one of aluminum, zinc, nickel, and chrome. The metal substrate may have a thickness that is equal to or greater than 0.1 mm.

A buffer layer 312 may be arranged on the display substrate 311. The buffer layer 312 may completely cover an upper surface of the display substrate 311. The buffer layer 312 may include at least one of an inorganic material and an organic material. The buffer layer 312 may include a single layer or multiple layers.

A TFT may be arranged on the buffer layer 312. The TFT may be a top gate transistor. However, the TFT may also be a bottom gate transistor.

A semiconductor active layer 313 may be arranged on the buffer layer 312.

The semiconductor active layer 313 may include a source area 314 and a drain area 315, which are doped with n-type impurity ions or p-type impurity ions. An area between the source area 314 and the drain area 315 may be a channel area 316, which is not doped with impurities. The semiconductor active layer 313 may include at least one of an organic semiconductor and an inorganic semiconductor. For example, the semiconductor active layer 313 may include amorphous silicon. As another example, the semiconductor active layer 313 may include an oxide semiconductor.

A gate insulating layer 317 may be arranged on the semiconductor active layer 313. The gate insulating layer 317 may include an inorganic layer. The gate insulating layer 317 may include a single layer or multiple layers.

A gate electrode 318 may be arranged on the gate insulating layer 317. The gate electrode 318 may include a metal material having a high conductivity such as silver, copper, gold, or aluminum. The gate electrode 318 may include a single layer or multiple layers.

An interlayer insulating layer 319 may be arranged on the gate electrode 318. The interlayer insulating layer 319 may include at least one of an inorganic layer and an organic layer.

A source electrode 320 and a drain electrode 321 may be arranged on the interlayer insulating layer 319. In detail, a contact hole may be formed in the gate insulating layer 317 and the interlayer insulating layer 319 by partially removing the gate insulating layer 317 and the interlayer insulating layer 319. The source electrode 320 may be electrically connected to the source area 314 and the drain electrode 321 may be electrically connected to the drain area 315 through the contact hole.

A passivation layer 322 may be arranged on the source electrode 320 and the drain electrode 321. The passivation layer 322 may include at least one of an inorganic layer and an organic layer. A planarization layer 323 may be arranged on the passivation layer 322. The planarization layer 323 includes an organic layer. Any one of the passivation layer 322 and the planarization layer 323 may be omitted.

The TFT may be electrically connected to the OLED.

The OLED may be arranged on the planarization layer 323. The OLED includes a first electrode 325, an intermediate layer 326, and a second electrode 327.

The first electrode 325 may function as an anode and may include various conductive materials. The first electrode 325 may include a transparent electrode or a reflection electrode. For example, when the first electrode 325 includes a transparent electrode, the first electrode 325 may include a transparent conductive layer. When the first electrode 325 includes a reflection electrode, the first electrode 325 may include a reflective layer and a transparent conductive layer on the reflective layer.

A pixel-defining layer 324 may be arranged on the planarization layer 323. The pixel-defining layer 324 may cover a portion of the first electrode 325. In detail, the pixel-defining layer 324 may define an emission area of each of sub-pixels by surrounding an edge of the first electrode 325. The first electrode 325 may be patterned in each sub-pixel.

The pixel-defining layer 324 may include an organic layer or an inorganic layer. The pixel-defining layer 324 may include a single layer or multiple layers.

The intermediate layer 326 may be arranged on an area of the first electrode 325, the area being exposed by etching a portion of the pixel-defining layer 324. The intermediate layer 326 may be formed by deposition.

The intermediate layer 326 may include an organic emission layer.

According to a selective embodiment, the intermediate layer 326 may include an organic emission layer and may further include at least one of a hole injection layer (HIL), a hole transport layer (HTL), an electron transport layer (ETL), and an electron injection layer (EIL). However, exemplary embodiments are not limited to an intermediate layer 326 having HIL, HTL, ETL, and EIL layers. The intermediate layer 326 may include an organic emission layer along with various other functional layers.

The second electrode 327 may be arranged on the intermediate layer 326.

The second electrode 327 may function as a cathode. The second electrode 327 may include a transparent electrode or a reflection electrode. For example, when the second electrode 327 includes a transparent electrode, the second electrode 327 may include a metal layer and a transparent conductive layer on the metal layer. When the second electrode 327 includes a reflection electrode, the second electrode 327 may include a metal layer.

According to an exemplary embodiment, a plurality of sub-pixels may be arranged on the display substrate 311. For example, at least some sub-pixels may realize at least one of a red, green, blue, and white color. However, the present inventive concept is not limited thereto.

The encapsulation portion 340 may cover the OLED. The encapsulation portion 340 may include an inorganic layer 341 and an organic layer 342, which are alternately stacked. For example, the inorganic layer 341 may include a first inorganic layer 343, a second inorganic layer 344, and a third inorganic layer 345. The organic layer 342 may include a first organic layer 346 and a second organic layer 347.

The organic emission layer may be formed on the intermediate layer 326 by various methods. For example, organic emission layers of different colors may be deposited on pixels of a substrate by using a chemical vapor deposition (CVD) device. However, it may be difficult to form the organic emission layers evenly on the substrate by using the CVD, due to surface tension deposition materials passing through an opening of a mask. Also, according to the CVD, the mask is located on a deposition source. Thus, the mask may be deformed due to its own weight.

According to exemplary embodiment, an organic emission layer is formed on a substrate by an inkjet roller method.

Figure 4:
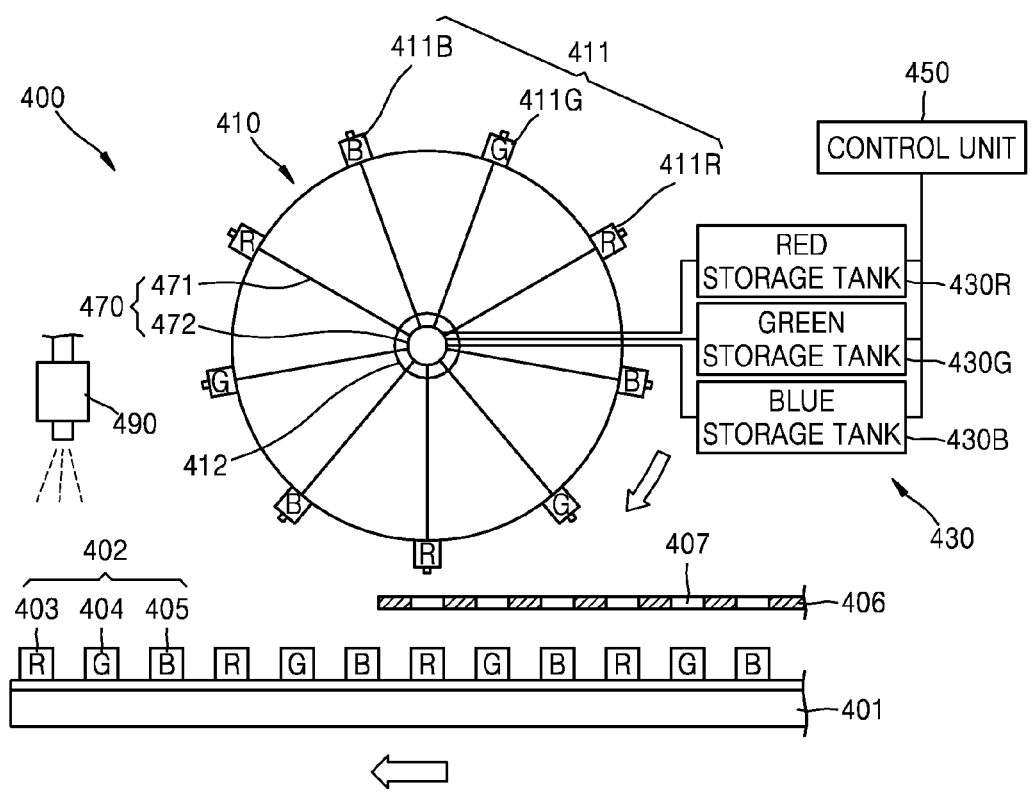
FIG. 4 is a diagram for describing a method of forming an organic emission layer on a substrate by using an inkjet roller device, according to an exemplary embodiment.
Figure 5:
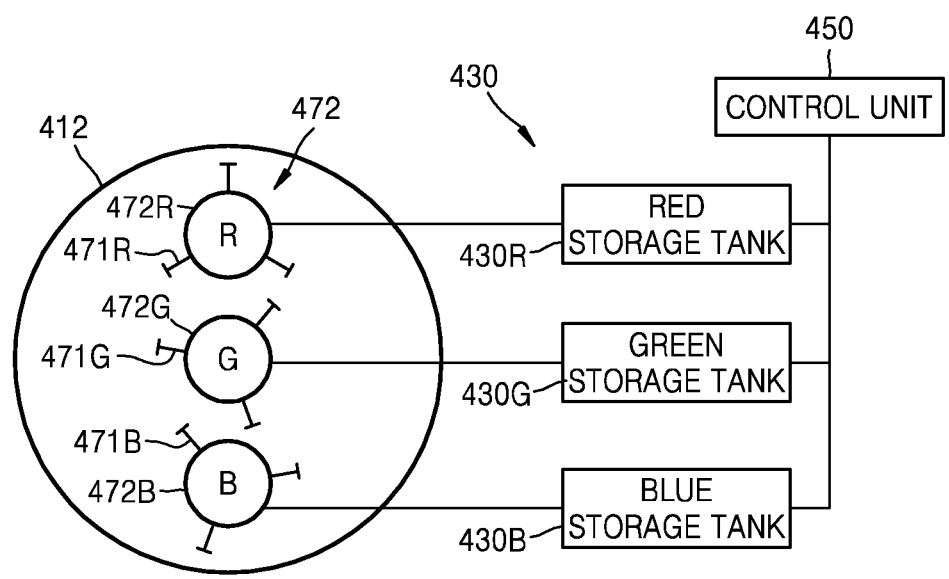
FIG. 5 is a side view of a center of the inkjet roller device of FIG. 4.

FIG. 4 is a diagram for describing a method of forming an organic emission layer 402 on a substrate by using an inkjet roller device according to an exemplary embodiment. FIG. 5 is a side view of a center of the inkjet roller device of FIG. 4.

Referring to FIGS. 4 and 5, an inkjet roller device 400 includes an inkjet roller 410, an ink storage tank 430, and a control unit 450.

The inkjet roller 410 may be mounted on a substrate 401. A mask 406 may be mounted between the substrate 401 and the inkjet roller 410. The mask 406 may include an opening 407 corresponding to a pattern of a organic emission layer 402 formed on the substrate 401. According to an exemplary embodiment, the organic emission layer 402 includes a red R emission layer 403, a green G emission layer 404, and a blue B emission layer 405.

The inkjet roller 410 may include a plurality of ink headers 411. The ink headers 411 may discharge ink of a color corresponding to the organic emission layer 402, onto the substrate 401, through the opening 407 of the mask 406.

The ink headers 411 include a red ink header 411R for discharging ink for the red R emission layer 403, a green ink header 411G for discharging ink for the green G emission layer 404, and a blue ink header 411B for discharging ink for the blue B emission layer 405.

The red ink header 411R, the green ink header 411G, and the blue ink header 411B may be spaced apart from each other along an outer circumferential surface of the inkjet roller 410. When the inkjet roller 410 rotates, the red ink header 411R, the green ink header 411G, and the blue ink header 411B may sequentially discharge the inks of the colors corresponding to the red emission layer 403, the green emission layer 404, and the blue emission layer 405 onto the substrate 401.

According to an exemplary embodiment, the inkjet roller 410 has a cylindrical shape. The plurality of ink headers 411 may be arranged in the inkjet roller 410 to discharge ink of the same color onto the same line in a length direction of the inkjet roller 410. Ink of the same color may be simultaneously discharged onto sub-pixels that are arranged apart from one another in the same line in a direction of the substrate 401, for example, a width direction.

According to an exemplary embodiment, the plurality of ink headers 411 are arranged in the inkjet roller 410 to discharge inks of different colors, onto the same line in a length direction of the inkjet roller 410. Inks of different colors may be simultaneously discharged onto sub-pixels of different colors, which are spaced apart from one another in the same line in a direction of the substrate 401.

The ink headers 411 may be connected to the ink storage tank 430 for storing inks corresponding to colors of the organic emission layer 402, by a connection unit 470. The connection unit 470 may include a plurality of connection pipes 471 and a plurality of connection tanks 472 respectively connected to the connection pipes 471.

The connection pipes 471 may be mounted in an inner space of the inkjet roller 410. The connection pipes 471 may be connected to the red ink header 411R, the green ink header 411G, and the blue ink header 411B. The connection pipes 471 may include a red connection pipe 471R connected to the red ink header 411R, a green connection pipe 471G connected to the green ink header 411G, and a blue connection pipe 471B connected to the blue ink header 411B.

The plurality of connection pipes 471 may be respectively connected to the connection tanks 472, which are prepared for each color. The connection tanks 472 may be mounted inside a central axis 412 of the inkjet roller 410. The connection tanks 472 may include a red connection tank 472R, a green connection tank 472G, and a blue connection tank 472B.

The plurality of red connection pipes 471R may be connected to the red connection tank 472R, the plurality of green connection pipes 471G may be connected to the green connection tank 472G, and the plurality of blue connection pipes 471B may be connected to the blue connection tank 472B.

The connection tanks 472 may be connected to the ink storage tank 430. The ink storage tank 430 includes a red ink storage tank 430R, a green ink storage tank 430G, and a blue ink storage tank 430B.

The red ink storage tank 430R, the green ink storage tank 430G, and the blue ink storage tank 430B may respectively store inks of colors corresponding to the red emission layer 403, the green emission layer 404, and the blue emission layer 405, which are formed on the substrate 401.

The red connection tank 472R, the green connection tank 472G, and the blue connection tank 472B may be connected to the red ink storage tank 430R, the green ink storage tank 430G, and the blue ink storage tank 430B, respectively, so as to be supplied with the ink colors corresponding to the organic emission layer 402.

The red ink storage tank 430R, the green ink storage tank 430G, and the blue ink storage tank 430B may be mounted outside the inkjet roller 410. The red ink storage tank 430R, the green ink storage tank 430G, and the blue ink storage tank 430B may be connected to the red connection tank 472R, the green connection tank 472G, and the blue connection tank 472B, respectively, at a side surface of the inkjet roller 410, in order to avoid interference with the inkjet roller 410 that rotates.

The red ink storage tank 430R, the green ink storage tank 430G, and the blue ink storage tank 430B may be connected to the control unit 450. The control unit 450 may control a color of ink and an amount of ink that is to be discharged onto the substrate 401 from the red ink header 411R, the green ink header 411G, and the blue ink header 411B.

A curing unit 490 for curing the ink discharged onto the substrate 401 may be mounted adjacent to the inkjet roller 410. The curing unit 490 may be an ultraviolet (UV) curing device. The curing unit 490 may be a heating device that cures the ink by applying a certain amount of heat to the ink.

Multiple curing units 490 may be provided to stabilize the inks discharged onto the substrate 401. The ink may be cured in a multistage method by using the plurality of curing units 490.

The organic emission layer 402 may be formed on the substrate 401 by using the inkjet roller 410, while the substrate 401 is transported by a roll-to-roll method.

Figure 6:
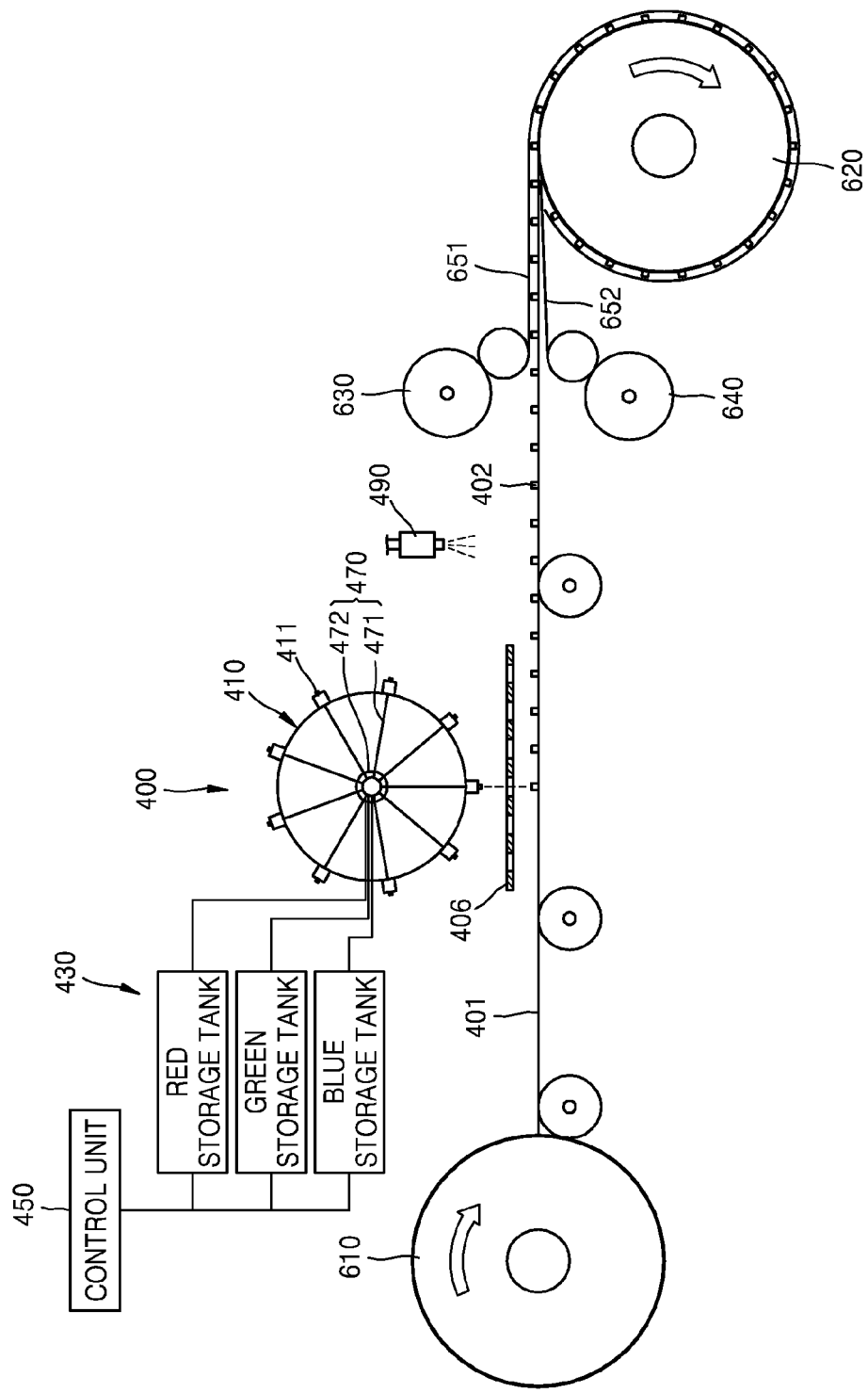
FIG. 6 is a diagram for describing a method of forming an organic emission layer on a substrate by a roll-to-roll method by using the inkjet roller device of FIG. 4.

Referring to FIG. 6, a first roller 610 and a second roller 620 may be mounted in a front end and a rear end of the inkjet roller 410.

The first roller 610 may be mounted on a first side of the inkjet roller 410. The substrate 401, which does not have the organic emission layer 402, may be rolled onto the first roller 610. The first roller 610 may supply the substrate 401 toward the inkjet roller 410. The second roller 620 may be mounted on a second side of the inkjet roller 410 and may roll the substrate 401, on which the organic emission layer 402 is formed. The curing unit 490 may be mounted between the inkjet roller 410 and the second roller 620 for curing ink on the substrate 401.

A third roller 630 and a fourth roller 640 may further be mounted adjacent to the second roller 620. Each of the third roller 630 and the fourth roller 640 includes a plurality of rollers.

At least one cover film 651 and 652 may be rolled on the substrate 401. For example, a third roller 630 may roll the cover film 651. As another example, a fourth roller 640 may roll the cover film 652. As a further example, the third roller 630 may roll the cover film 651 and the fourth roller 640 may roll the cover film 652. The third roller 630 and the fourth roller 640 face each other. The cover films 651 and 652 may be bonded on the substrate 401 proceeding through the third roller 630 and the fourth roller 640. The cover films 651 and 652 may protect a surface of the substrate 401.

The process of forming the organic emission layer 402 on the substrate 401 by using the inkjet roller device 400 having the above structure will be described as follows by referring to FIG. 4, FIG. 5, and FIG. 6.

The substrate 401 may be unrolled from the first roller 610. The substrate 401 unrolled from the first roller 610 may be transported in a direction. The substrate 401 may be transported to the inkjet roller 410. The mask 406 may be arranged on the transported substrate 401.

The mask 406 may have the opening 407 corresponding to a pattern of the organic emission layer 402, which is to be formed on the substrate 401. The mask 406 may be formed by using a thin plate.

The inkjet roller 410 may be arranged on the mask 406. The inkjet roller 410 may rotate and when the inkjet roller 410 rotates, inks of colors corresponding to the red emission layer 403, the green emission layer 404, and the blue emission layer 405 may be sequentially discharged, from the red ink header 411R, the green ink header 411G, and the blue ink header 411B. The red ink header 411R, the green ink header 411G, and the blue ink header 411B may be spaced apart from each other along an outer circumferential surface of the inkjet roller 410.

In detail, the red ink header 411R, the green ink header 411G, and the blue ink header 411B may be connected to the red connection pipe 471R, the green connection pipe 471G, and the blue connection pipe 471B, respectively, which are mounted in the inner space of the inkjet roller 410.

The red connection pipe 471R, the green connection pipe 471G, and the blue connection pipe 471B may be connected to the red connection tank 472R, the green connection tank 472G, and the blue connection tank 472B, respectively, which are mounted inside the central axis 412 of the inkjet roller 410.

The red connection tank 472R, the green connection tank 472G, and the blue connection tank 472B may be connected to the red ink storage tank 430R, the green ink storage tank 430G, and the blue ink storage tank 430B, respectively, which are mounted outside the inkjet roller 410.

When the control unit 450 determines an color and an amount that is to be discharged onto the substrate 401, the ink storage tank 430 supplies the ink of the corresponding color to the connection tank 472, according to a signal of the control unit 450.

In detail, an ink color corresponding to any one organic emission layer 402 from among the red emission layer 403, the green emission layer 404, and the blue emission layer 405 that are to be formed on the substrate 401, may be supplied to any one of the red connection tank 472R, the green connection tank 472G, and the blue connection tank 472B, from any one of the red ink storage tank 430R, the green ink storage tank 430G, and the blue ink storage tank 430B.

The ink supplied to the connection tank 472 may pass through the connection pipe 471 and may be discharged to the outside of the ink headers 411. The ink discharged from the ink headers 411 may be loaded onto an area of the substrate 401 through the opening 407 of the mask 406.

In detail, the ink supplied to any connection tank 472 from among the red connection tank 472R, the green connection tank 472G, and the blue connection tank 472B may pass through any connection pipe 471 from among the red connection pipe 471R, the green connection pipe 471G, and the blue connection pipe 471B. The ink may be discharged from any ink header 411 from among the red ink header 411R, the green ink header 411G, and the blue ink header 411B. The ink discharged from any ink header 411 from among the red ink header 411R, the green ink header 411G, and the blue ink header 411B may be loaded onto a sub-pixel area of the substrate 401, in which any one organic emission layer 402 from among the red emission layer 403, the green emission layer 404, and the blue emission layer 405 is formed.

The substrate 401 may be transported in one direction, and at the same time, the inkjet roller 410 rotates, in order to discharge ink of a different color in another sub-pixel area of the substrate 401. Here, the ink may be discharged from the ink headers 411 at a normal temperature and pressure.

As described above, while the inkjet roller 410 rotates, the inkjet roller 410 may sequentially discharge inks of different colors onto the substrate 401.

According to an exemplary embodiment, when the substrate 401 is transported in one direction, ink of the same color may be simultaneously loaded onto a plurality of sub-pixels arranged in the same line of the substrate 401. For example, the ink headers 411 may discharge the ink of the same color in a length direction of the inkjet roller 410, so that the ink of the same color may be simultaneously loaded onto the sub-pixels of the same color of the substrate 401.

According to another exemplary embodiment, the ink headers 411 may discharge inks of different colors in a length direction of the inkjet roller 410, so that the inks of different colors may be simultaneously loaded onto sub-pixels of different colors arranged in the same line.

According to an exemplary embodiment, inks of a plurality of colors may be discharged onto the substrate 401, while the substrate 401 is fixed and the inkjet roller 410 both rotates and linearly moves.

When the ink is loaded onto the substrate 401, UV rays may be irradiated onto the substrate 401 from the curing unit 490 mounted adjacent to the inkjet roller 410. The ink is cured by the curing unit 490 so that the red emission layer 403, the green emission layer 404, and the blue emission layer 405 may be formed on the substrate 401.

According to an exemplary embodiment, multiple curing units 490 may be mounted for stabilizing the ink, and the ink may be cured in a multistage method by using the curing units 490. Accordingly, the ink having fluidity may be half-hardened or fully hardened.

After the ink is hardened, the substrate 401 may proceed through the third roller 630 and the fourth roller 640. When the substrate 401 proceeds through the third roller 630 and the fourth roller 640, the first cover film 651 and the second cover film 652 may be bonded on both surfaces of the substrate 401.

The substrate 401, on which the organic emission layer 402 is formed, may be rolled onto the second roller 620.

As described above, according to various exemplary embodiments, the device for manufacturing an organic light-emitting display apparatus and the method of manufacturing an organic light-emitting display apparatus by using the same may form an organic emission layer on a substrate by a roll-injection method. Thus, a loss of a raw material for the organic emission layer may be reduced, and it is easy to make a large display device.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A method of manufacturing an organic light-emitting display apparatus, the method comprising:
arranging a mask on a substrate, the mask having an opening corresponding to a pattern of an organic emission layer;
forming the organic emission layer by:
disposing an inkjet roller on the mask;
supplying inks from ink storage tanks external to the inkjet roller to connection tanks;
supplying the inks from the connection tanks mounted inside a central axis of the inkjet roller to ink headers mounted on the inkjet roller via connection pipes;
discharging the inks onto the substrate from the ink headers, through the opening of the mask, by rotating the inkjet roller according to a signal of a control unit; and
curing the organic emission layer,
wherein the connection tanks comprise a plurality of connection tanks respectively corresponding to colors of the organic emission layer and disposed inside the central axis of the inkjet roller and wherein the plurality of connection tanks supplies the inks comprising the colors of the organic emission layer to corresponding ink headers of the ink headers mounted on the inkjet roller.

2. The method of claim 1, further comprising discharging the inks onto the substrate by transporting the substrate in one direction.

3. The method of claim 2, wherein the substrate is rigid.

4. The method of claim 2, wherein the substrate is flexible.

5. The method of claim 4, wherein:

a first roller and a second roller are provided at a front end and a rear end of the inkjet roller, and the substrate is unrolled from the first roller and transported to the inkjet roller, the inks are discharged onto the substrate by using the inkjet roller, and the substrate is rolled onto the second roller.

6. The method of claim 1, wherein inks of different colors are discharged through the ink headers and onto the substrate from the inkjet roller.

7. The method of claim 6, wherein the inks of different colors correspond to colors of the organic emission layer.

8. The method of claim 7, wherein:

the ink headers are spaced apart from each other on an outer circumferential surface of the inkjet roller, and the inks of different colors are sequentially discharged onto the substrate while the inkjet roller rotates.

9. The method of claim 7, wherein the inks of different colors are discharged from the ink headers, through the opening of the mask, and onto the substrate.

10. The method of claim 7, wherein an ink of one color is simultaneously loaded onto sub-pixels arranged in one line of the substrate.

11. The method of claim 1, wherein the inks discharged onto the substrate are cured by ultraviolet light.

* * * * *